US009385016B2

(12) United States Patent
Nakata et al.

(10) Patent No.: US 9,385,016 B2
(45) Date of Patent: Jul. 5, 2016

(54) SEMICONDUCTOR PROCESSING SYSTEM AND PROGRAM

(75) Inventors: Teruo Nakata, Yokohama (JP); Hideaki Kondo, Kudamatsu (JP); Keita Nogi, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 286 days.

(21) Appl. No.: 12/966,429

(22) Filed: Dec. 13, 2010

(65) Prior Publication Data
US 2011/0144792 A1    Jun. 16, 2011

(30) Foreign Application Priority Data

Dec. 14, 2009 (JP) ................................. 2009-282995

(51) Int. Cl.
*H01L 21/67*   (2006.01)
*H01L 21/677*  (2006.01)

(52) U.S. Cl.
CPC .... *H01L 21/67276* (2013.01); *H01L 21/67184* (2013.01); *H01L 21/67748* (2013.01)

(58) Field of Classification Search
CPC ................. G05B 19/4189; G05B 2219/45031; G05B 23/02; H01L 21/67745; H01L 21/67201; H01L 21/67772; H01L 21/67769; H01L 21/67733; H01L 21/67736; H01L 21/67276; H01L 21/67184; H01L 21/67748
USPC ............ 700/112, 95, 110, 105, 121; 414/217, 414/222.01, 222.13
See application file for complete search history.

(56) References Cited

U.S. PATENT DOCUMENTS

| 6,074,443 | A  | * | 6/2000 | Venkatesh et al. ........... 29/25.01 |
| 6,201,999 | B1 |   | 3/2001 | Jevtic |
| 6,519,498 | B1 | * | 2/2003 | Jevtic et al. ................... 700/101 |
| 6,725,114 | B1 |   | 4/2004 | Jevtic |
| 7,283,890 | B2 |   | 10/2007 | Iijima et al. |
| 7,603,195 | B2 | * | 10/2009 | Puri et al. ....................... 700/112 |
| 8,267,632 | B2 | * | 9/2012 | van der Meulen et al. ... 414/217 |

(Continued)

FOREIGN PATENT DOCUMENTS

| JP | 06-267806 | 9/1994 |
| JP | 10-189687 | 7/1998 |

(Continued)

OTHER PUBLICATIONS

Office Action in JP 2013-052633, dispatch date Mar. 4, 2014, (in Japanese, 2 pgs.), (English language translation, 5 pgs.).

*Primary Examiner* — Kenneth M Lo
*Assistant Examiner* — Jason Lin
(74) *Attorney, Agent, or Firm* — Baker Botts L.L.P.

(57) ABSTRACT

In a processing system of a linear tool in which plural carrying robots are arranged in carrying mechanical units to which processing modules are coupled and a processing target is delivered and received between the plural carrying robots, in the case where there are plural carrying routes on which the processing target is carried, the present invention provides a technique for determining the carrying route on which the highest throughput can be obtained.

In the processing system of a linear tool, in the case where there are plural carrying routes on which the processing target is carried, the throughputs of the respective carrying routes are compared to each other, and the carrying route is determined by a unit for selecting the carrying route with the highest throughput.

18 Claims, 12 Drawing Sheets

| DESTINATION CANDIDATE NUMBER | CARRYING ROUTE CANDIDATE NUMBER | WAFER NUMBER | CARRYING ORDER | CARRYING OPERATION | CARRYING ROBOT |
|---|---|---|---|---|---|
| 1 | 1 | W1 | 1 | LL→PM1 | VR1 |
| 1 | 1 | W1 | 2 | PM1→PM2 | VR1 |
| 1 | 1 | W1 | 3 | PM2→LL | VR1 |
| 1 | 1 | W2 | 1 | LL→PM1 | VR1 |
| 1 | 1 | W2 | 2 | PM1→PM2 | VR1 |
| 1 | 1 | W2 | 3 | PM2→LL | VR1 |
| 1 | 1 | W3 | 1 | LL→PM1 | VR1 |
| 1 | 1 | W3 | 2 | PM1→PM2 | VR1 |
| 1 | 1 | W3 | 3 | PM2→LL | VR1 |
| 2 | 2 | W1 | 1 | LL→PM1 | VR1 |
| 2 | 2 | W1 | 2 | PM1→WS1 | VR1 |
| 2 | 2 | W1 | 3 | WS1→PM3 | VR2 |
| 2 | 2 | W1 | 4 | PM3→WS1 | VR2 |
| 2 | 2 | W1 | 5 | WS1→LL | VR1 |
| 2 | 2 | W2 | 1 | LL→PM1 | VR1 |
| 2 | 2 | W2 | 2 | PM1→WS1 | VR1 |
| 2 | 2 | W2 | 3 | WS1→PM3 | VR2 |
| 2 | 2 | W2 | 4 | PM3→WS1 | VR2 |
| 2 | 2 | W2 | 5 | WS1→LL | VR1 |
| 2 | 2 | W3 | 1 | LL→PM1 | VR1 |
| 2 | 2 | W3 | 2 | PM1→WS1 | VR1 |
| 2 | 2 | W3 | 3 | WS1→PM3 | VR2 |
| 2 | 2 | W3 | 4 | PM3→WS1 | VR2 |
| 2 | 2 | W3 | 5 | WS1→LL | VR1 |

(56) References Cited

U.S. PATENT DOCUMENTS

| | | | |
|---|---|---|---|
| 2001/0014372 A1* | 8/2001 | Katano et al. | 427/299 |
| 2002/0147960 A1* | 10/2002 | Jevtic et al. | 716/19 |
| 2004/0249494 A1* | 12/2004 | Kobayashi et al. | 700/112 |
| 2005/0111938 A1* | 5/2005 | van der Meulen | 414/217 |
| 2006/0182536 A1* | 8/2006 | Rice | H01L 21/67173 414/217 |
| 2009/0076648 A1* | 3/2009 | Numakura et al. | 700/228 |
| 2010/0023151 A1* | 1/2010 | Shieh et al. | 700/105 |
| 2012/0004753 A1* | 1/2012 | Ogi | 700/100 |

FOREIGN PATENT DOCUMENTS

| | | |
|---|---|---|
| JP | 11-330197 | 11/1999 |
| JP | 2002-511193 | 4/2002 |
| JP | 2003-197711 | 7/2003 |
| JP | 2007-511104 | 4/2007 |
| WO | WO 98/57358 | 12/1998 |
| WO | WO01/54187 | 7/2001 |
| WO | WO 2005/048313 A2 | 5/2005 |

* cited by examiner

FIG. 9

| WAFER NUMBER | PROCESSING STEP |
|---|---|
| W1 | 1 |
| W2 | 2 |
| W3 | 1 |

FIG. 10

| PROCESSING STEP | PROCESSING ORDER | PROCESSING MODULE CONDITION | PROCESSING TIME |
|---|---|---|---|
| 1 | 1 | A | 20 |
| 1 | 2 | B | 20 |
| 2 | 1 | A | 30 |
| 2 | 2 | B | 10 |

FIG. 11

| PROCESSING MODULE | PROCESSING MODULE CONDITION |
|---|---|
| PM1 | A |
| PM2 | B |
| PM3 | B |
| PM4 | C |

FIG. 12

| WAFER NUMBER | PROCESSING ORDER | AVAILABLE PROCESSING MODULE | PROCESSING TIME |
|---|---|---|---|
| W1 | 1 | PM1 | 20 |
| W1 | 2 | PM2、PM3 | 20 |
| W2 | 1 | PM1 | 30 |
| W2 | 2 | PM2、PM3 | 10 |
| W3 | 1 | PM1 | 20 |
| W3 | 2 | PM2、PM3 | 20 |

FIG. 13

| DESTINATION CANDIDATE NUMBER | WAFER NUMBER | PROCESSING ORDER | PROCESSING MODULE FOR USE | PROCESSING TIME |
|---|---|---|---|---|
| 1 | W1 | 1 | PM1 | 20 |
| 1 | W1 | 2 | PM2 | 20 |
| 1 | W2 | 1 | PM1 | 30 |
| 1 | W2 | 2 | PM2 | 10 |
| 1 | W3 | 1 | PM1 | 20 |
| 1 | W3 | 2 | PM2 | 20 |
| 2 | W1 | 1 | PM1 | 20 |
| 2 | W1 | 2 | PM3 | 20 |
| 2 | W2 | 1 | PM1 | 30 |
| 2 | W2 | 2 | PM3 | 10 |
| 2 | W3 | 1 | PM1 | 20 |
| 2 | W3 | 2 | PM3 | 20 |

FIG. 14

| MODULE | ROBOT |
|---|---|
| LL | VR1 |
| PM1 | VR1 |
| PM2 | VR1 |
| PM3 | VR2 |
| PM4 | VR2 |
| WS1 | VR1 |
| WS1 | VR2 |

FIG. 15

| DESTINATION CANDIDATE NUMBER | CARRYING ROUTE CANDIDATE NUMBER | WAFER NUMBER | CARRYING ORDER | CARRYING OPERATION | CARRYING ROBOT |
|---|---|---|---|---|---|
| 1 | 1 | W1 | 1 | LL→PM1 | VR1 |
| 1 | 1 | W1 | 2 | PM1→PM2 | VR1 |
| 1 | 1 | W1 | 3 | PM2→LL | VR1 |
| 1 | 1 | W2 | 1 | LL→PM1 | VR1 |
| 1 | 1 | W2 | 2 | PM1→PM2 | VR1 |
| 1 | 1 | W2 | 3 | PM2→LL | VR1 |
| 1 | 1 | W3 | 1 | LL→PM1 | VR1 |
| 1 | 1 | W3 | 2 | PM1→PM2 | VR1 |
| 1 | 1 | W3 | 3 | PM2→LL | VR1 |
| 2 | 2 | W1 | 1 | LL→PM1 | VR1 |
| 2 | 2 | W1 | 2 | PM1→WS1 | VR1 |
| 2 | 2 | W1 | 3 | WS1→PM3 | VR2 |
| 2 | 2 | W1 | 4 | PM3→WS1 | VR2 |
| 2 | 2 | W1 | 5 | WS1→LL | VR1 |
| 2 | 2 | W2 | 1 | LL→PM1 | VR1 |
| 2 | 2 | W2 | 2 | PM1→WS1 | VR1 |
| 2 | 2 | W2 | 3 | WS1→PM3 | VR2 |
| 2 | 2 | W2 | 4 | PM3→WS1 | VR2 |
| 2 | 2 | W2 | 5 | WS1→LL | VR1 |
| 2 | 2 | W3 | 1 | LL→PM1 | VR1 |
| 2 | 2 | W3 | 2 | PM1→WS1 | VR1 |
| 2 | 2 | W3 | 3 | WS1→PM3 | VR2 |
| 2 | 2 | W3 | 4 | PM3→WS1 | VR2 |
| 2 | 2 | W3 | 5 | WS1→LL | VR1 |

FIG. 16

| CARRYING OPERATION | CARRYING ROBOT | OPERATION TIME |
|---|---|---|
| LL→PM1 | VR1 | 10 |
| PM1→PM2 | VR1 | 10 |
| PM2→LL | VR1 | 10 |
| PM1→WS1 | VR1 | 5 |
| WS1→PM3 | VR2 | 5 |
| PM3→WS1 | VR2 | 5 |
| WS1→LL | VR1 | 5 |

FIG. 17

| CARRYING ROUTE CANDIDATE NUMBER | THROUGHPUT |
|---|---|
| 1 | 0.018 |
| 2 | 0.019 |

SEMICONDUCTOR PROCESSING SYSTEM AND PROGRAM

CLAIM OF PRIORITY

The present application claims priority from Japanese patent application JP 2009-282995 filed on Dec. 14, 2009, the content of which is hereby incorporated by reference into this application.

BACKGROUND OF THE INVENTION

1. Field of the Invention

The present invention relates to a processing system in the semiconductor manufacturing field, and particularly to a processing system of a linear tool.

2. Description of the Related Arts

In a processing system of a semiconductor, a processing system having a structure called as a cluster tool has been widely used. The cluster tool involves a problem that a large space is required to install a processing system, and the required space becomes larger along with the increased diameter of a wafer. Thus, there has been proposed a processing system having a structure called as a linear tool which can be installed even in a small space (see Japanese Unexamined Patent Application Publication No. 2007-511104).

The cluster tool is different from the linear tool in the structure of an internal carrying region which carries a wafer into a processing module and carries a wafer out of a processing module. The cluster tool generally has one carrying robot which carries a wafer in the internal carrying region, and one carrying robot carries a wafer between a load lock serving as a carrying-in/carrying-out port for the internal carrying region and the processing modules. On the other hand, the linear tool has plural carrying robots arranged in the internal carrying region, allows a wafer to be delivered and received between the plural carrying robots, and allows a wafer to be carried between the load lock and the processing modules. However, the carrying robot engaged in carriage differs depending on the position of the processing module to which a wafer is carried. Depending on the position of the processing module, a wafer can be carried by only one carrying robot, or cannot be carried unless the wafer goes through the plural carrying robots.

Further, it is important to improve a throughout in the processing system of a semiconductor. A general processing system includes plural processing modules, and plural wafers are processed in parallel. At this time, the throughput is deteriorated unless the carrying robots sequentially carry the plural wafers. Accordingly, there is known a scheduling method as a method of improving the throughput. In the scheduling method, the timing of carrying and processing each wafer is calculated so as to increase the throughput in consideration of restriction of operations of the carrying robots, and each wafer is carried in accordance with the calculated timing (see Japanese Unexamined Patent Application Publication No. 2002-511193).

In the scheduling method, when a carrying route is provided, the timing of carrying and processing a wafer is calculated so as to improve the throughput on the carrying route. Here, the carrying route means a direction ranging from where a processing target wafer is carried into the processing system to where the wafer is carried out of the processing system after the wafer is processed in the processing modules. The carrying route is determined if a carrying-in port, a processing module to which the wafer is carried, and a carrying-out port are determined. Especially, in the case of a processing system including plural processing modules, if a processing module to which the wafer is carried is not determined for each wafer to be carried, the carrying route is not determined and the scheduling cannot be performed. As a method of determining the processing module to which the wafer is carried, there is known a method in which the processing modules are assigned to a wafer to be carried in ascending order of the completion time of the process (Japanese Patent Application Laid-Open Publication No. H10-189687).

SUMMARY OF THE INVENTION

In the cluster tool, the highest throughput can be obtained by a conventional method of determining a carrying route. The reason is as follows. Since the number of carrying robots which carry a wafer in the internal carrying region is one, if a wafer is carried on a different carrying route, the same carrying robot is engaged in the carriage, and the time required for carriage and restriction matters related to carriage are the same. Accordingly, a different carrying route has no influence on the throughput, and thus it is only necessary to determine a carrying route in consideration of only the processing time of the processing module.

However, in the linear tool, the carrying robot engaged in carriage in the internal carrying region differs depending on the position of the processing module to which the wafer is carried. If a wafer is carried on a different carrying route, the time required for carriage and restriction matters related to carriage become different, resulting different throughputs. Accordingly, there is a high possibility that the highest throughput cannot be obtained by the conventional method of determining a carrying route.

Accordingly, an object of the present invention is to determine a carrying route on which the highest throughput can be obtained in a linear tool.

According to a representative embodiment of the present invention, there is provided a semiconductor processing system including: plural processing modules which process plural processing targets; plural carrying robots which deliver and receive the processing targets to/from the respective processing modules; and an operation control unit which controls operation of the processing modules and the carrying modules, wherein each of the carrying modules is coupled to at least one of the plural processing modules, and the carrying modules are coupled to each other, and the operation control unit is configured to generate a plurality of candidates of carrying routes for the plurality of processing targets using a device structure information of the semiconductor processing system, each of the plurality of candidates of carrying routes specifying whether one or both of the carrying modules will be used for one of the processing targets and which of the processing modules will be used for said one of the processing targets and including different routes constituted by different choices of the carrying module or carrying modules selected from the at least two carrying modules, and then determine specific carrying routes by calculating throughput of the each of the plurality of candidates of carrying routes for the plurality of processing targets based on the operation time of the carrying modules, processing time at the processing modules and operation time and processing time required for another one of the processing targets which will be processed.

Further, according to an embodiment of the present invention, there is provided an operation control unit configured to generate a plurality of candidates of carrying routes for the plurality of processing targets that each specify whether one or both of the carrying modules will be used for one of the processing targets and which of the processing modules will be used for said one of the processing targets and then to determine specific carrying routes by calculating throughout of the each of the plurality of candidates of carrying routes for the plurality of processing targets based on the operation time of the carrying modules, processing time at the processing modules and operation time and processing time required for another one of the processing targets which will be processed.

According to an aspect of the present invention, in the case where plural carrying routes are provided for a processing target in a processing system of a linear tool, the carrying route with the highest throughput can be selected, and thus the throughput of the processing system can be improved.

BRIEF DESCRIPTION OF THE DRAWINGS

FIG. 9 is a diagram for showing a concrete example of processing target wafer information;
FIG. 10 is a diagram for showing a concrete example of processing step information;
FIG. 11 is a diagram for showing a concrete example of processing module information;
FIG. 12 is a diagram for showing a concrete example of available processing module information;
FIG. 13 is a diagram for showing a concrete example of destination candidate information;
FIG. 14 is a diagram for showing a concrete example of device structure information;
FIG. 15 is a diagram for showing a concrete example of carrying route candidate information;
FIG. 16 is a diagram for showing a concrete example of operation time information;
and
FIG. 17 is a diagram for showing a concrete example of throughput information.

DETAILED DESCRIPTION OF THE PREFERRED EMBODIMENT

An embodiment of the present invention will be described using the drawings.

Figure 1:
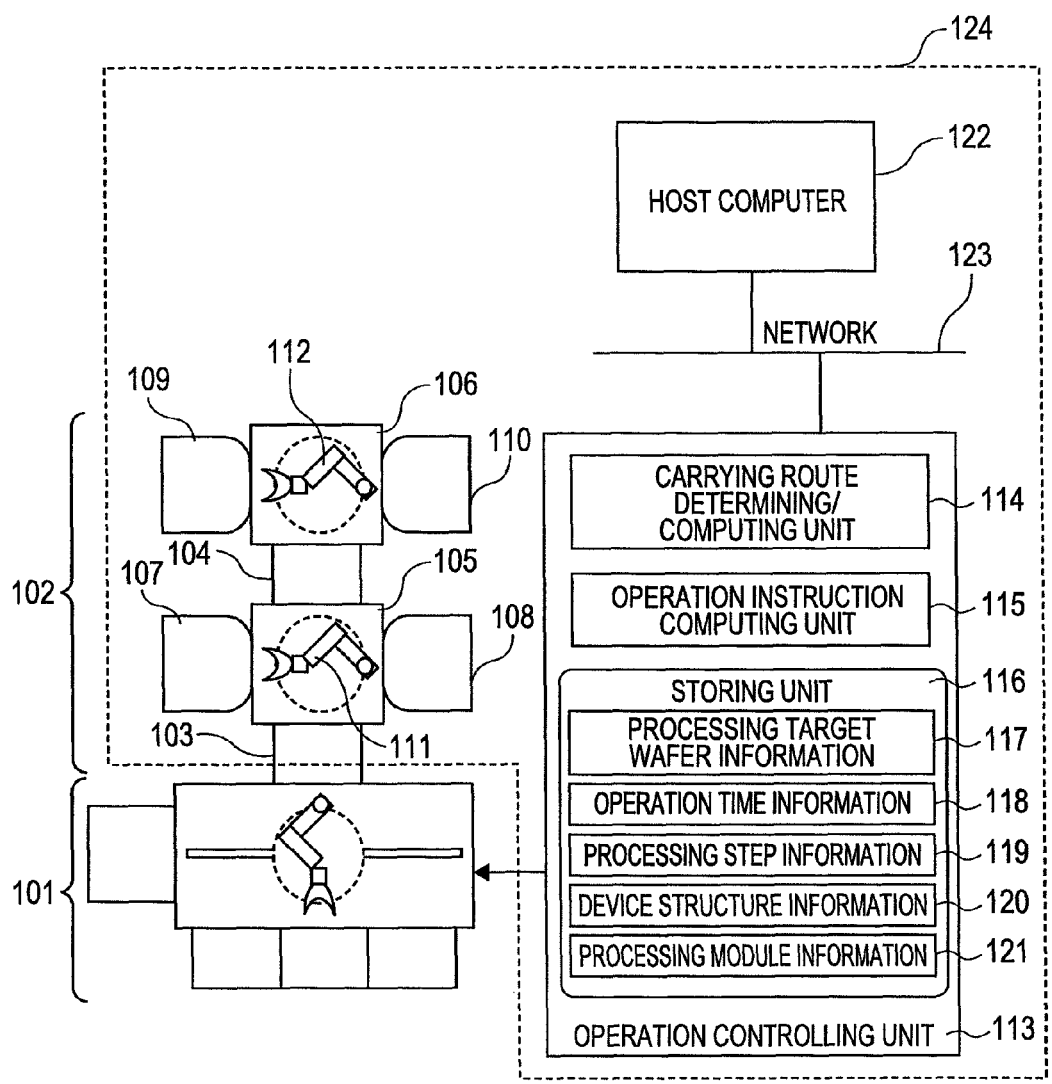
FIG. 1 is a diagram for explaining a configuration of a semiconductor processing system.

In a linear tool according to the present invention described below, plural carrying robots (105 to 106) are arranged in an internal carrying region 102, a wafer is delivered and received between the plural carrying robots, and the wafer is carried between a load lock 103 and processing modules (107 to 110) as shown in FIG. 1. It should be noted that a cluster tool is largely different from a linear tool in that a general cluster tool includes one carrying robot which carries a wafer in the internal carrying region whereas a linear tool includes plural carrying robots.

FIG. 1 is a diagram for explaining a configuration of a semiconductor processing system according to the present invention. The semiconductor processing system includes an external carrying region 101 and the internal carrying region 102 in which physical carrying operations are performed, and an operation controlling unit 113 which controls the operations. In many cases, the inside of the external carrying region 101 is kept at the atmospheric pressure state and the inside of the internal carrying region 102 is kept at the vacuum state in the semiconductor processing system. In addition, the processing system 124 is coupled to a host computer 122 through a network 123, and can obtain information from the host computer 122 if needed. Hereinafter, the respective regions will be described.

The external carrying region 101 carries a processing target wafer located outside the processing system into the inside of the processing system or carries the same out of the processing system. Further, the external carrying region 101 carries the wafer into the load lock 103 coupled to the internal carrying region 102 or carries the same out of the load lock 103. The pressure in the load lock 103 can be reduced or increased. After the wafer is carried in from the external carrying region 101, the pressure in the load lock 103 is reduced to be in the vacuum state as similar to the internal carrying region 102, so that the wafer can be discharged to the internal carrying region 102. On the contrary, after the wafer is carried in from the internal carrying region 102, the pressure in the load lock 103 is increased to be in the atmospheric pressure state, so that the wafer can be discharged to the external carrying region 101.

The internal carrying region 102 includes carrying modules 105 and 106, a waiting space 104 disposed between the plural carrying modules, and processing modules 107, 108, 109, and 110. A carrying robot 111 and a carrying robot 112 are arranged at the carrying module 105 and the carrying module 106, respectively. The carrying robots 111 and 112 carry the wafer into or out of the processing modules, the load lock, and the waiting space adjacent to the carrying modules, and allow the wafer to move among the processing modules, the load lock, and the waiting space.

Each processing module has a function of performing a process such as etching on the wafer. A gate valve is disposed at a wafer carrying-in/carrying-out port of each processing module. When the wafer is processed, the gate valve is closed, and when the wafer is carried into or out of the processing module, the gate valve is opened.

A space on which the wafer is placed is provided in the waiting space, and the respective carrying robots of the carrying modules adjacent to the waiting space can carry the wafer into or out of the processing module. Therefore, after one carrying robot caries the wafer into the waiting space and the operation is completed, the other carrying robot carries the wafer out of the waiting space, so that the wafer can be delivered and received between the carrying modules.

The operation controlling unit 113 is a computer including a microprocessor, a memory, and the like, and includes a carrying route determining/computing unit 114, an operation instruction computing unit 115, and a storing unit 116. The carrying route determining/computing unit 114 performs processes related to determination of a carrying route of the present invention.

The operation instruction computing unit 115 controls respective operations such as carrying-in/carrying-out operations and transfer operations of the wafer performed by the carrying robots, a pressure applying/reducing operation of the load lock, processing operations of the processing modules, and opening/closing operations of the gate valves on the basis of the carrying route determined by the carrying route determining/computing unit 114. The storing unit 116 holds processing target wafer information 117, operation time information 118, processing step information 119, device structure information 120, and processing module information 121 which are necessary for computing processes. Among these information, the processing module information 121 is generated by sensors provided in the processing modules 107, 108, 109, and 110, and is always transmitted to the operation controlling unit 113.

On the other hand, the processing target wafer information 117, the operation time information 118, the processing step information 119, and the device structure information 120 are managed in the host computer 122 which is coupled to the semiconductor processing system through the network 123, and are transmitted from the host computer 122 to the operation controlling unit 113 if needed.

A system including the internal carrying region 102, the operation controlling unit 113, the host computer 122 and the like as described above is herein referred to as the semiconductor processing system 124.

Figure 2A:
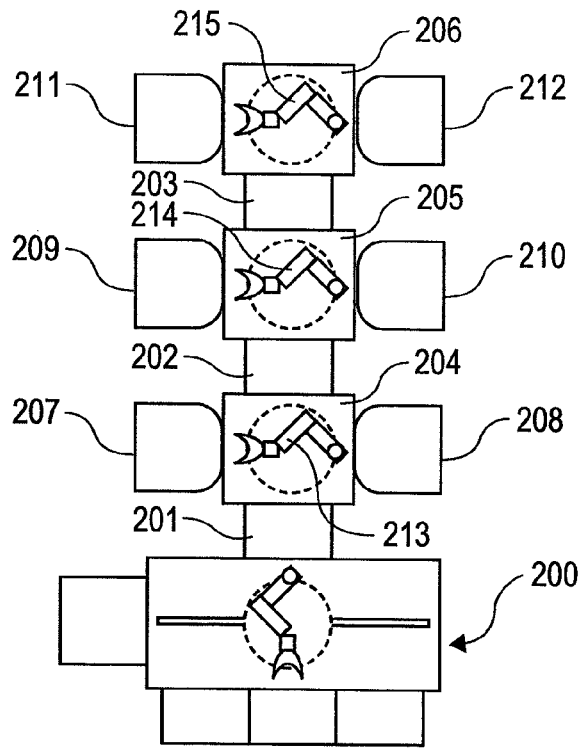
FIGS. 2A and 2B are diagrams, each explaining a variation of configurations of the semiconductor processing system.
Figure 2B:
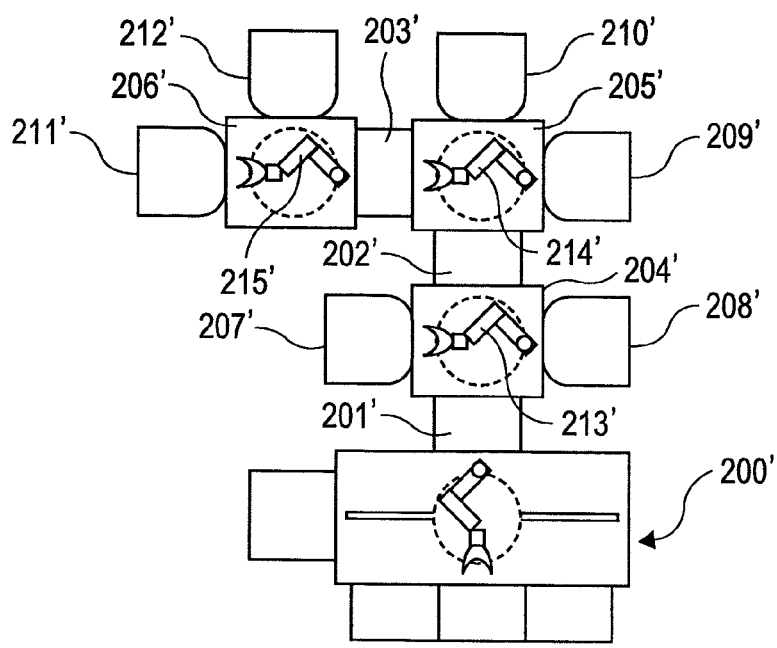

In the semiconductor processing system 124, the structure of the internal carrying region 102 can be changed. As exemplified in FIGS. 2A and 2B, the arrangement of the processing modules (207 to 212 or 207' to 212'), the carrying modules (213 to 215 or 213' to 215'), and the waiting spaces (202 to 203 or 202' to 203') can be freely changed. As the conditions of the arrangement, the processing modules and the waiting spaces are always adjacent to the carrying modules. The embodiment will be described on the basis of the arrangement of the internal carrying region shown in FIG. 1. However, the arrangement is an example, but does not limit the scope of the present invention.

Next, operation control of the semiconductor processing system 124 will be described. In the first place, a carrying route is determined for each processing target wafer. Here, the carrying route used in the embodiment means a direction ranging from where the processing target wafer is carried into the processing system to where the wafer is carried out of the processing system after the wafer is processed in the processing modules, if not otherwise specified. On the basis of the carrying route, the respective operations such as carrying-in/carrying-out operations and transfer operations of the wafer performed by the carrying robots, a pressure applying/reducing operation of the load lock, processing operations of the processing modules, and opening/closing operations of the gate valves are performed. Followings are methods for determining the respective operations.

(1) Scheduling Method

In the scheduling method, the respective operations necessary for carrying each processing target wafer on the determined carrying route are calculated in advance to preliminarily determine the respective operations, and are performed in accordance with the calculated operations. There are different variations of logics for calculating the respective operations in accordance with objects. The objects are, for example, to maximize the operation rates of the processing modules or to maximize the throughput.

(2) Dispatch Method

In the dispatch method, conditions to start the respective operations such as carrying-in/carrying-out operations and transfer operations of the wafer performed by the carrying robots, a pressure applying/reducing operation of the load lock, processing operations of the processing modules, and opening/closing operations of the gate valves are set. If the conditions are met, the operations are started. For example, as the conditions of an operation of opening the gate valve of a processing module, the conditions such as "the carrying robot holds a wafer to be carried into the processing module", "another wafer is not processed in the processing module", and "the gate valves of the other processing modules are closed" are set as rules. If the conditions are met, the operation of opening the gate valve is performed.

Such rules for the operation conditions are set for each operation. Further, there is a possibility that the conditions to start the operations are met for plural operations. In such a case, a priority rule is set to give priority to one of the operations. As one example of the priority rule, the first operation whose operation starting conditions are met is performed.

As described above, some methods are provided in the operation control, and there are different variations of the detailed calculation logics and conditions. The embodiment will be described based on the semiconductor processing system in which operation control is performed so as to give priority to the first operation whose operation starting conditions are met as a priority rule in the case where the operation starting conditions are met at the same time in the dispatch method. However, this is an example, but does not limit the scope of the present invention.

Next, a series of operations of the processing system 124 for one processing target wafer will be described.

Figure 3:
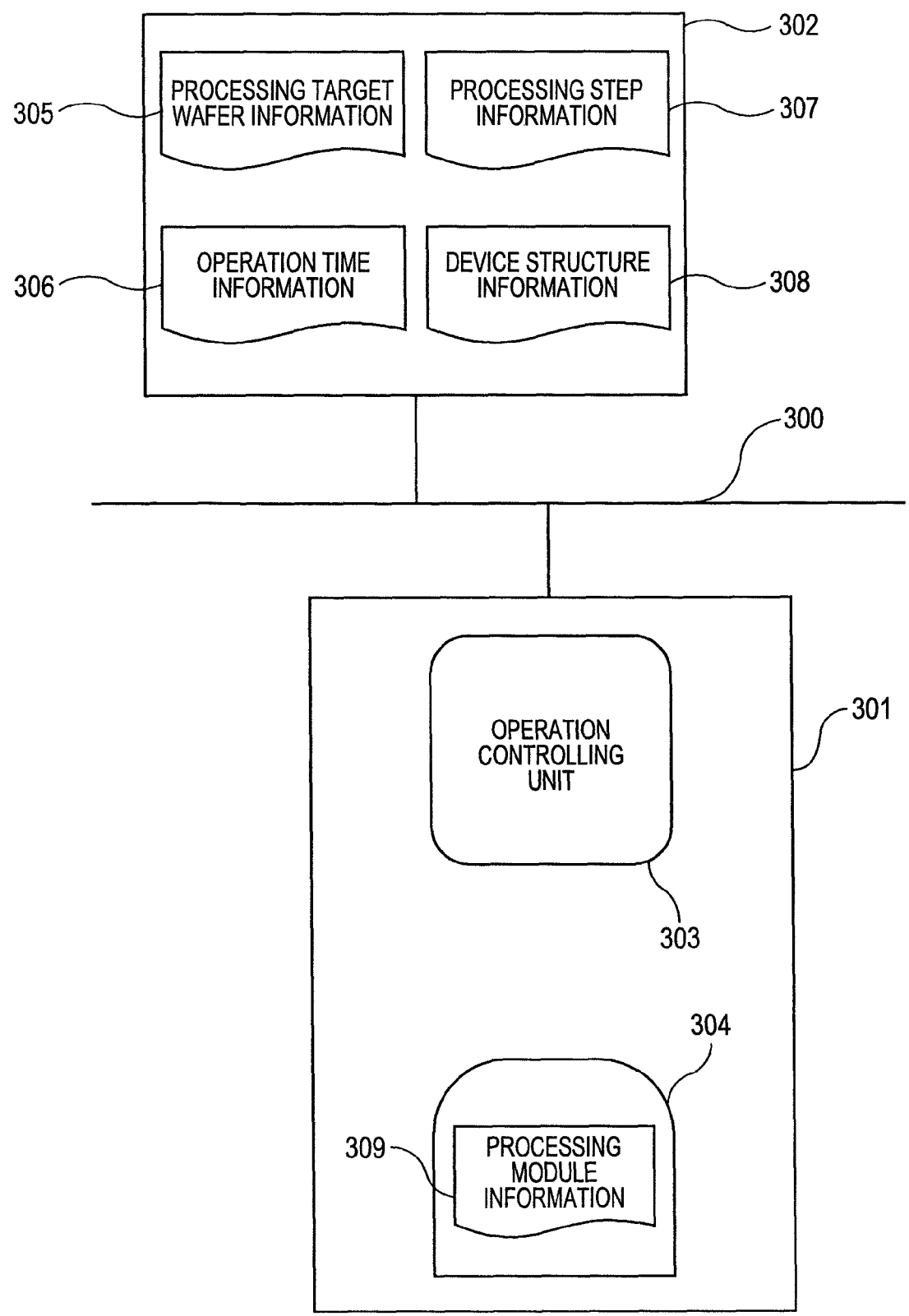
FIG. 3 is a diagram for showing a relation between transmission and reception of information necessary for controlling the semiconductor processing system.

Hereinafter, the explanation of the operations will be listed in order using FIG. 1. It should be noted that FIG. 3 shows a relation between transmission and reception of information necessary for controlling a semiconductor processing system 301, and the reference numerals corresponding to those in FIG. 1 are represented using the symbol [ ] below.

Before a processing target wafer arrives, the processing target wafer information 117 [305], the operation time information 118 [306], the processing step information 119 [307], and the device structure information 120 [308] are transmitted from the host computer 122 [302] to the operation controlling unit 113 [303].

The processing module information 121 is always transmitted from the processing modules 107 to 110 to the operation controlling unit.

When the processing target wafer arrives, the external carrying region 101 reads identification information of the target wafer and transmits the information to the operation controlling unit 113.

Since the operation controlling unit 113 preliminarily holds data of processing steps in accordance with the target wafer and the states of the processing modules 107 to 110, the operation controlling unit 103 determines a carrying route on the basis of the data and data of the target wafer.

It is assumed that the processing module 109 serves as one into which the wafer is carried.

The external carrying region 101 carries the wafer into the load lock 103.

After the gate valve of the load lock 103 located on the side of the external carrying region 101 is closed, the pressure is reduced in the load lock 103, and the inside of the load lock 103 is made into the vacuum state.

When the gate valve located on the side of the internal carrying region 102 is opened, the carrying robot 111 carries the wafer out of the load lock 103.

The carrying robot 111 pivots until it faces in the direction of the waiting space while holding the wafer, and then places the wafer on the waiting space 104.

The other carrying robot 112 takes the wafer out of the waiting space 104.

After the carrying robot 112 pivots until it faces in the direction of the processing module 109 while holding the wafer, the gate valve of the processing module 109 is opened and the carrying robot 112 carries the wafer into the processing module 109.

The processing module 109 processes the wafer.

After completion of the process, the gate valve of the processing module 109 is opened, the carrying robot 112 carries the wafer out of the processing module 109.

The carrying robot 112 pivots until it faces in the direction of the waiting space 104 while holding the wafer, and then places the wafer on the waiting space 104.

The other carrying robot 111 takes the wafer out of the waiting space 104.

After the carrying robot 111 pivots until it faces in the direction of the load lock 103 while holding the wafer, the gate valve of the load lock 103 is opened and the carrying robot 111 carries the wafer into the load lock 103.

After the gate valve of the load lock 103 located on the side of the internal carrying region 102 is closed, the pressure is applied in the load lock 103, and the inside of the load lock 103 is made into the atmospheric pressure state.

When the gate valve of the load lock 103 located on the side of the external carrying region 101 is opened, the external carrying region 101 carries the wafer out of the load lock 103. The external carrying region 101 stores the wafer into a wafer storage place outside the semiconductor processing system 124 [301].

It should be noted that a control signal from the host computer 302 is transmitted to the semiconductor processing system 301 through a network 300 as shown in FIG. 3.

A series of operations described herein are performed for one wafer. However, the semiconductor processing system 124 can process plural wafers at the same time. When a lot case in which plural wafers are mounted arrives at the semiconductor processing system 124 [301], the above-described operations are performed for each wafer. Further, plural lot cases can be processed at the same time. As described above, in the case where plural wafers are carried and processed at the same time, there is a case that the conditions to start the respective operations of the carrying robot and opening/closing of the gate valve are satisfied at the same time. In such a case, the operations are performed in order on the basis of the priority rule for operations.

Figure 4:
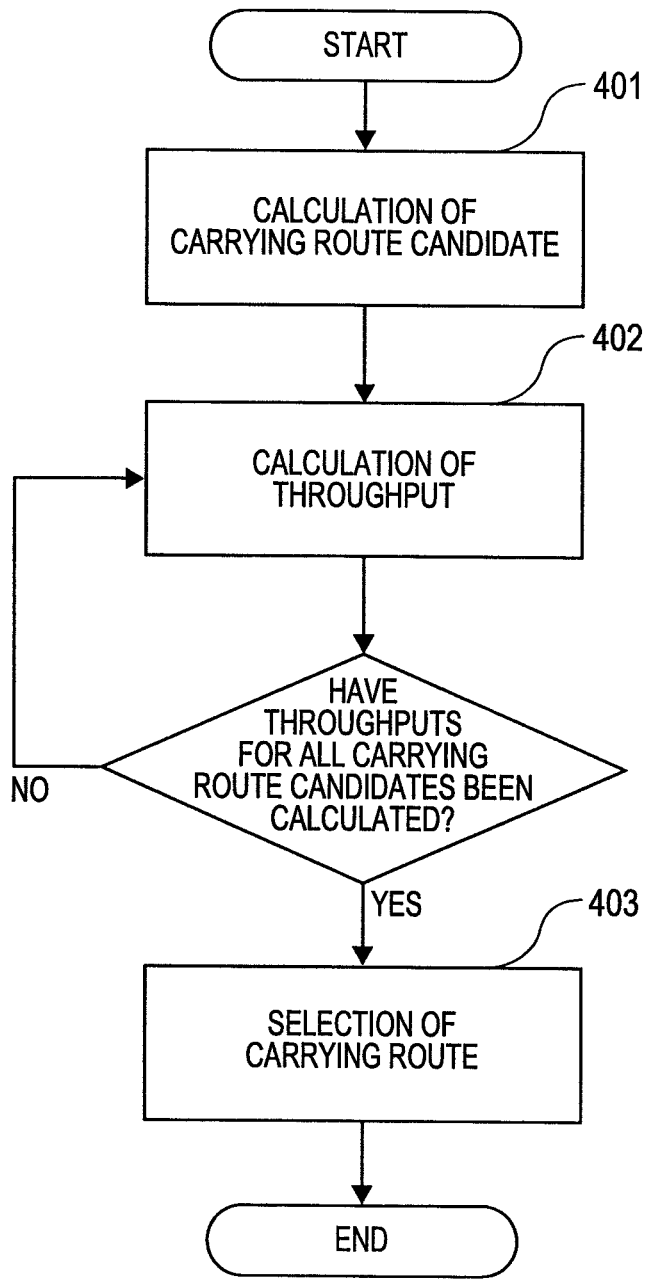
FIG. 4 is a diagram for explaining a processing flow for determining a carrying route.

Next, an outline of a carrying route determination process of the present invention will be described using FIG. 4. In the first place, a carrying route candidate calculating process 401 is performed. In the carrying route candidate calculating process 401, an available processing module candidate is calculated for the processing target wafer on the basis of the processing steps in accordance with the type of the wafer and the states of the processing modules, and a carrying route candidate is calculated on the basis of the available processing module candidate. The detail of the process will be described later.

Next, a throughput is calculated (402) for each carrying route candidate calculated in the process 401. In the throughput calculating process 402, scheduling is performed on the basis of the given carrying route, a carrying order on the carrying route is calculated, and a throughout corresponding to the number of wafers to be carried per unit time is calculated on the basis of the carrying order. The detail of the process will be described later. The process 402 is repeated until the throughputs of the all carrying routes are obtained. If the process 402 is completed for the all carrying routes, the optimum carrying route is selected. In a carrying route selection process 403, the throughputs of the respective carrying route candidates calculated in the process 402 are compared with each other, and the carrying route with the optimum throughput is selected. The detail of the process will be described later. As described above, the optimum carrying route is determined.

Figure 5:
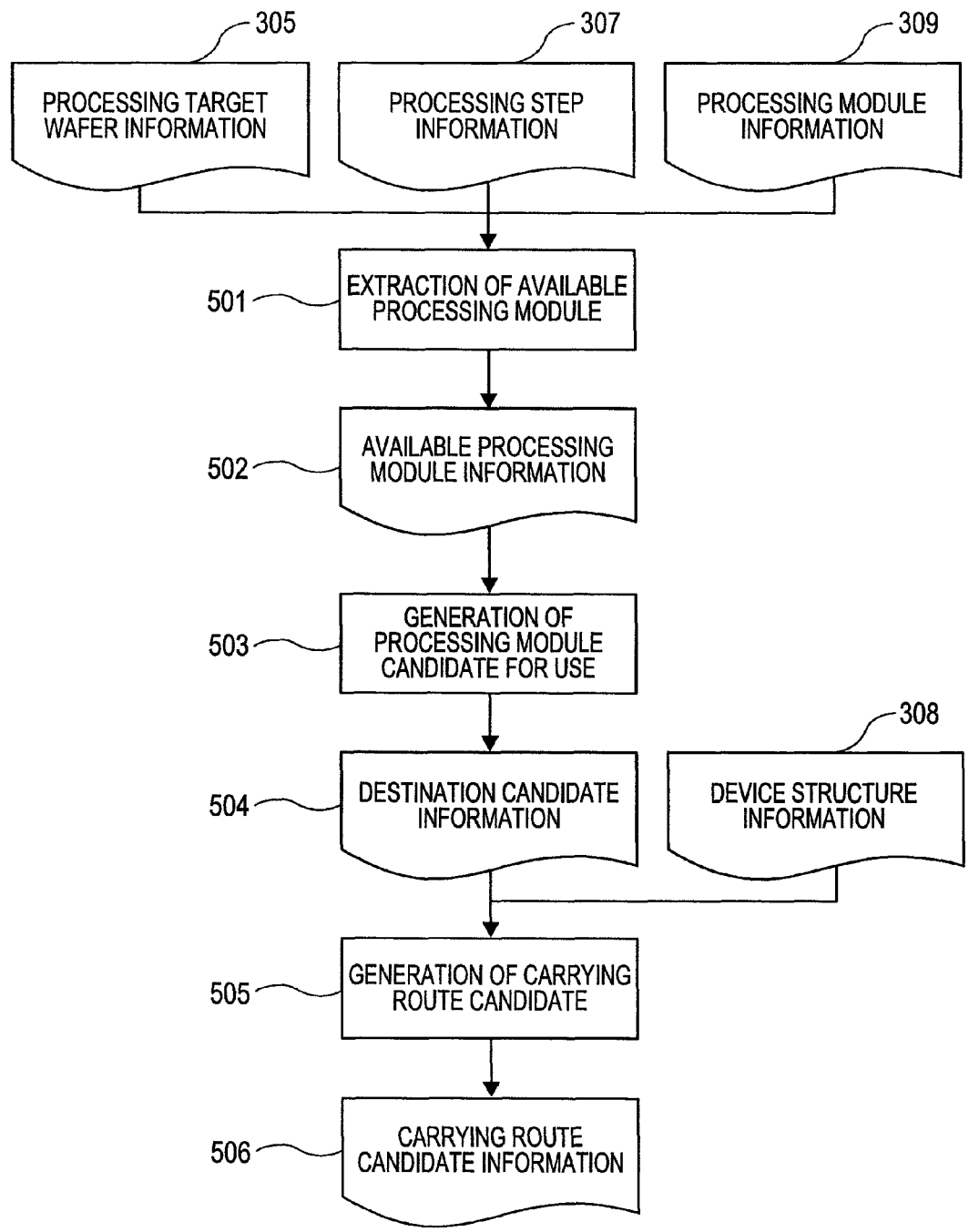
FIG. 5 is a diagram for explaining a process of calculating a candidate for the carrying route and input/output data.

Next, the detail of a carrying route candidate calculating process will be described using FIG. 5. In the first place, the processing target wafer information 305, the processing step information 307, and the processing module information 309 are input to generate available processing module information 502 in an available processing module extracting step 501 (503). The processing target wafer information 305 is information representing wafer numbers that are identification numbers of processing target wafers and processing steps to be performed for the respective wafers as exemplified in FIG. 9. The processing step information 307 is information representing processing steps, processing orders of the processing steps, conditions of the processing modules which process the wafer in the processing orders, and processing times in the processes as exemplified in FIG. 10. For example, a processing module condition A and processing time 20 in the processing order 1, and a processing module condition B and processing time 20 in the processing order 2 in the processing step 1 mean that a wafer having the processing step 1 is processed in a processing time of 20 by a processing module satisfying the processing module condition A, and is then processed in a processing time of 20 by a processing module satisfying the processing module condition B. The processing module information 309 is information representing the respective processing modules and conditions of the processing modules as exemplified in FIG. 11

By combining above-described information, information of available processing modules and the processing time in the processing order of each wafer is obtained as exemplified in FIG. 12. In the case where plural available processing modules are present in the processing order of a wafer, the all processing modules serve as available processing modules.

Next, in a step 503 of generating a processing module for use, available processing module information 502 is input to generate destination candidate information 504. In this step, one processing module used in the processing order of each wafer is selected, and is considered as one of destination candidates. Next, another available processing module changed from the selected processing module in the processing order of a wafer is considered as another destination candidate. The above-described procedure is repeated until the all available processing modules are selected in the processing order of each wafer, and the destination candidates are comprehensively extracted. Accordingly, destination information as exemplified in FIG. 13 is generated.

Next, in a carrying route candidate generating step 505, the destination candidate information 504 and the device structure information 308 are input to generate a carrying route candidate. The device structure information 308 is information representing the modules of the device and the carrying robots coupled to the modules as exemplified in FIG. 14. Here, a correspondence relation between symbols used in FIG. 14 and the reference numerals used in FIG. 1 will explained. The signs are represented by numbers in below for the purpose of simplification, and the respective signs represent those illustrated in FIG. 1. Specifically, LL corresponds to 103, VR1 to VR2 correspond to 111 to 112, respectively, WS1 corresponds to 104, and PM1 to PM4 correspond to 107 to 110, respectively.

For example, LL in FIG. 14 represents the load lock 103, and the load lock is coupled to a carrying robot VR1 (111). As similar to the above, PM1, PM2, PM3, and PM4 represent the processing modules, and WS1 represents the waiting space. They are coupled to the carrying robots VR1 and VR2. In this step, a carrying route passing through the processing modules for use in the processing order set for a wafer having a destination candidate of the destination candidate information 504 is extracted on the basis of the device structure information.

The wafer is carried starting from the load lock (LL) by the coupled carrying robot, processed in the respective processing modules, and carried to the load lock by the carrying robot. For example, as shown in FIG. 13, a wafer with a destination candidate number 2 and a wafer number W1 is processed by the processing module PM1 in the processing order 1 and processed by the processing module PM3 in the processing order 2. In this case, as shown in FIG. 14, when the wafer is carried from LL to PM1, the wafer is carried from LL to PM1 by VR1 because VR1 is coupled to both of LL and PM1. The carrying operation is represented by LL→PM1 (see FIG. 15).

Next, when the wafer is carried from PM1 to PM3, the wafer is delivered and received at WS1 by VR1 and VR2 because PM1 is coupled to VR1, PM3 is coupled to VR2, and VR1 and VR2 are coupled to WS1. Then, the wafer is carried from PM1 to the waiting space WS1 by VR1. The carrying operation is represented by PM1→WS1 (see FIG. 15).

Next, the wafer is carried from WS1 to PM3 by VR2. The carrying operation is represented by WS1→PM3. As similar to the above, when the wafer is carried from PM3 to LL, carrying operations such as PM3→WS1 and WS1→LL are performed (see FIG. 15). The order of the carrying operations is defined as a carrying order, and the carrying operation, the carrying order and the carrying robot for each wafer having a destination candidate are extracted to be defined as a carrying route candidate. The extraction of the carrying route candidate is performed for the all destination candidates. The result is represented as carrying route candidate information as exemplified in FIG. 15.

Figure 6:
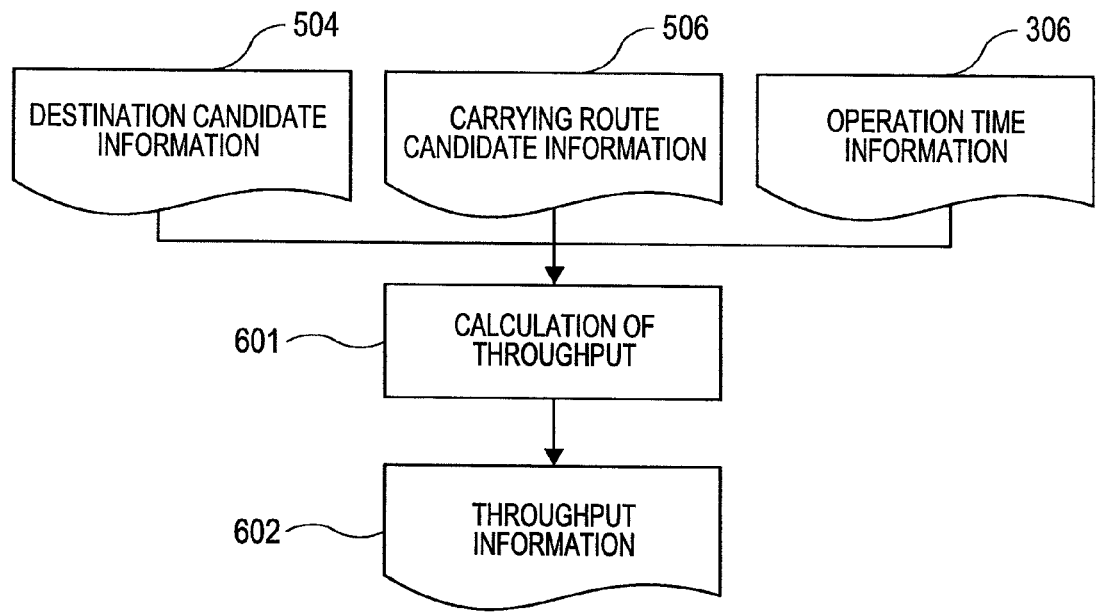
FIG. 6 is a diagram for explaining a process of calculating a throughput and input/output data.

Next, the detail of a throughput calculating process will be described using FIG. 6. In a throughput calculating process 601, the destination candidate information 504, the carrying route candidate information 506, and the operation time information 306 are input to generate throughput information 602. In this step, for a carrying route candidate, information of the carrying order, the carrying operation, and the carrying robot is extracted from the carrying route candidate information 506, information of the processing time at the destination processing module with the corresponding destination candidate number is extracted from the destination candidate information 504, and information of the corresponding carrying robot and the operation time of the carrying operation is extracted from the operation time information 306. A simulation is performed by inputting the extracted information. The simulation is performed in accordance with the method set as operation control.

In the embodiment, there will be described a simulation based on operation control in which the first operation whose operation starting conditions are met is given priority as a priority rule in the case where the operation starting conditions are met at the same time in the dispatch method.

The simulation is a calculation procedure in which operations are laid out while the time is set forward. As a calculation example of the simulation, a destination candidate number 1 exemplified in FIG. 15 will be described. The simulation is performed under the conditions where when lots in which wafer numbers W1, W2, and W3 are mounted arrive, a wafer number W0 of another lot is being processed in PM4 and the remaining processing time is 35. Further, as a rule, the wafers are inserted in the order of W1, W2, and W3. It should be noted that the operations of the external carrying region and the gate valves are omitted in the description of the example for the purpose of simple explanation, and thus only the operations of the carrying robots and the processing modules are simulated.

Figure 8:
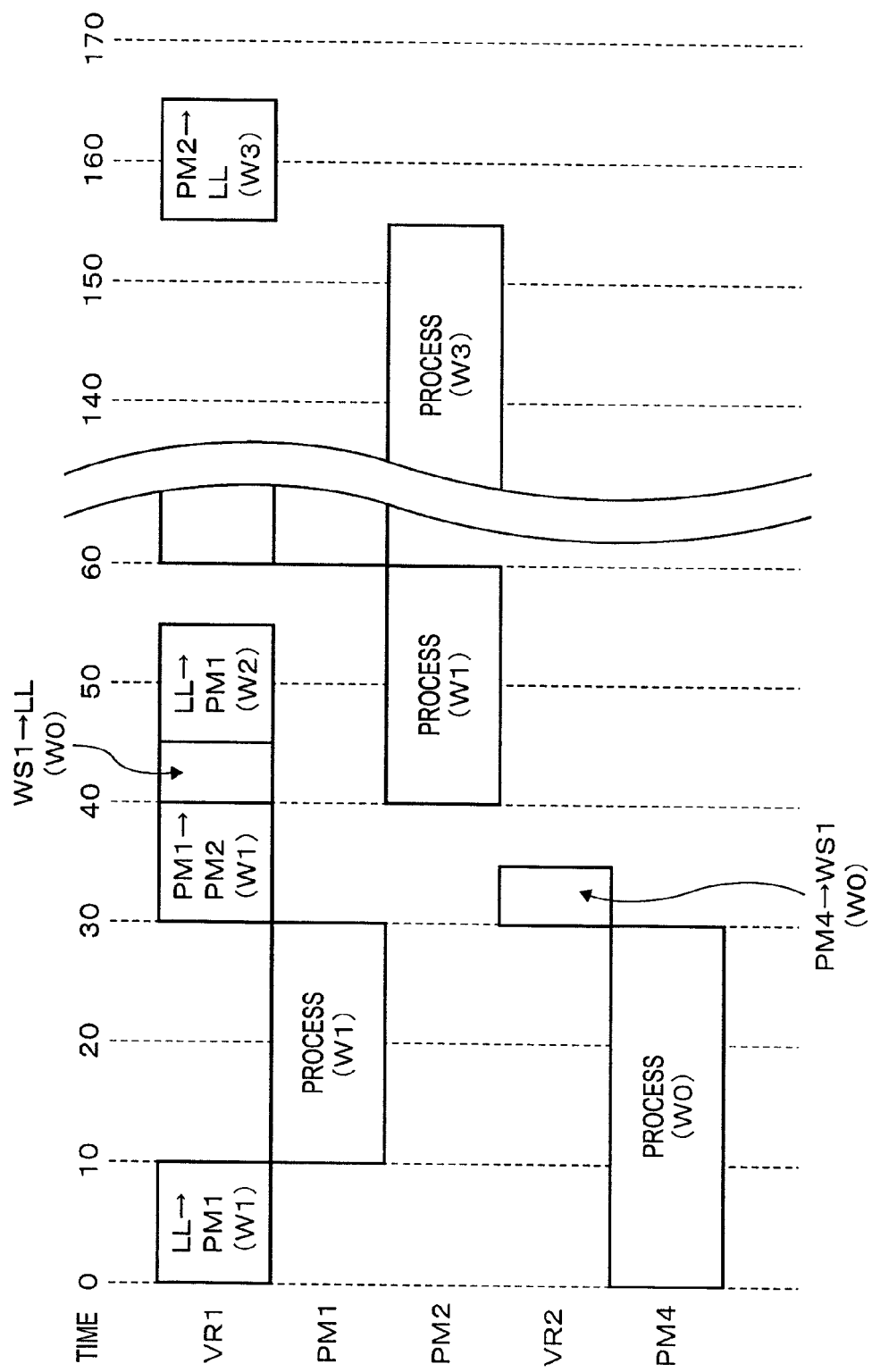
FIG. 8 is a diagram for explaining a carrying order in a carrying route candidate.

Hereinafter, an operation simulation will be described with reference to FIG. 8. In the first place, the simulation is started from a state in which W1 is stored in LL, no wafers are stored in PM1 and PM2, and W0 is being stored and processed in PM4 at time 0. In this case, operation starting conditions under which W1 is carried out of LL by VR1 to be carried into PM1 are satisfied. The operations are laid out as shown in the drawing. Next, the time is set forward to the time at which any one of the operations is completed and there is a possibility that the operation starting conditions are changed. In the case of the example, the required time for the operation of LL→PM1 (W1) by VR1 is 10 as shown in the conditions of FIG. 16. The time is set forward to 10. Here, it is checked whether or not the operation in which the operation starting conditions are satisfied is present. Since W1 is carried into PM1, the operation starting conditions of the process of PM1 are satisfied. Then, the operation of the process for W1 in PM1 is laid out starting from time 10.

Next, since the processing time for W1 in PM1 is 20 as shown in the conditions of FIG. 16, the time is set forward to 30. Here, the operation starting conditions for the operation of PM1→PM2 (W1) by VR1 and the operation starting conditions for the operation of PM4→WS1 (W0) by VR2 are satisfied because the process for W0 in PM4 is completed. Thus, the operations are laid out starting from time 30.

Next, when the time is set forward to 35, the operation of PM4→WS1 (W0) by VR2 is completed. Here, there are no operations under which the operation starting conditions are met. However, one of the operation starting conditions for WS1→LL (W0) by VR1 under which an already-processed wafer is present in WS1 is satisfied, and the processing system waits until no wafer is held in VR1. Then, it is assumed that W2 is stored into LL by the external carrying region at time 40. When the time is set forward to 40, no wafer is held in VR1. Thus, the operation starting conditions for WS1→LL (W0) by VR1, LL→PM1 (W2) by VR1 and the process for W1 in PM2 are satisfied. Here, the operations of WS1→LL (W0) and LL→PM1 (W2) cannot be performed at the same time because they are performed by VR1. In accordance with the priority rule in which priority is given to the first operation in which the operation starting conditions are met, priority is given to the operation of WS1→LL (W0) by VR1 because the processing system has waited to start the operation of WS1→LL (W0) from time 35 until no wafer is held in VR1 in this example. Further, the process for W1 in PM2 can be performed in parallel. As a result, the operation of WS1→LL (W0) by VR1 and the process for W1 in PM2 are laid out starting from time 40.

Next, when the time is set forward to 45, the operation starting conditions for LL→PM1 (W2) by VR1 are satisfied, the operation is laid out starting from time 45. The processes of laying out the operations while setting the time forward are repeated for the all processing wafers until the layout of the all operations including discharge of a wafer to the outside after completion of the processes is completed. In this example, the operation of carrying the wafer W3 from PM2 to LL by VR1 is laid out, and the layout of the all operations is completed.

From the result of the simulation, it is possible to obtain the completion time of the last operation among the all operations. The time corresponds to that required for carrying and processing the wafers. Thus, the number of processed wafers is divided by the required time, and the throughput that is the number of processed wafers per unit time can be calculated. For example, in the case of the example of FIG. 8, the operation of PM2→LL (W3) by VR1 is the last one, and the time is 165. Accordingly, the throughput of the carrying route candidate number 1 is 3/165 which is approximately equal to 0.018. Such the simulation and calculation of the throughput are performed for the all carrying route candidates. Accordingly, the throughput information of the respective carrying route candidates as exemplified in FIG. 17 is obtained.

Figure 7:
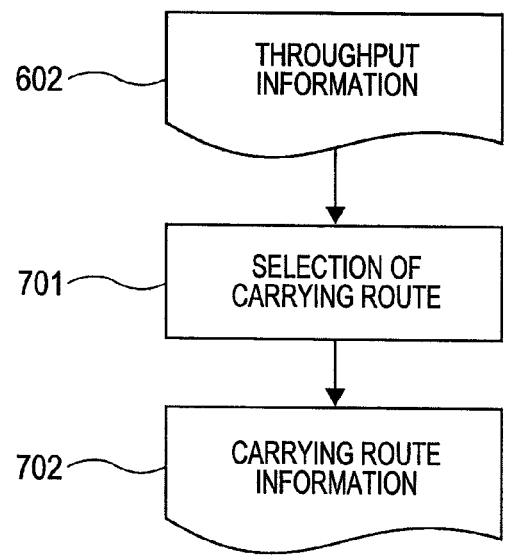
FIG. 7 is a diagram for explaining a process of selecting the carrying route and input/output data.

Next, a carrying route selection process will be described using FIG. 7. In a carrying route selection process 701, the throughput information 602 is input to generate carrying route information 702. The carrying route information 702 represents a carrying route on which a wafer is actually carried, and the carrying operation is controlled on the basis of the information. In this step, on the basis of the throughput information of the respective carrying route candidates calculated in the throughput calculating process, the throughputs are compared with each other, and the carrying route candidate with the highest throughput is determined as the carrying route. In this example, the throughput of the carrying route candidate 1 is 0.018, and the throughput of the carrying route candidate 2 is 0.019 as shown in FIG. 17. Accordingly, the carrying route of the carrying route candidate 2 is determined as the carrying route with the highest throughput.

As another embodiment of the present invention, plural carrying routes may be given by another system or may be manually input, in place of the carrying route candidate calculating process.

As still another embodiment of the present invention, the throughput may be obtained from throughput information which is additionally prepared for each carrying route, in place of the throughput calculating process.

What is claimed is:

1. A semiconductor processing system comprising:
    plural processing modules configured to process a plurality of processing targets;
    at least two carrying modules including carrying robots configured to deliver and receive the processing targets to/from the processing modules; and
    an operation control unit configured to control operation of the processing modules and the carrying modules,
    wherein each of the carrying modules is coupled to at least one of the plural processing modules, and the carrying modules are coupled to each other, and
    the operation control unit is configured to generate a plurality of candidates of carrying routes for the plurality of processing targets using a device structure information of the semiconductor processing system, each of the plurality of candidates of carrying routes specifying whether one or both of the carrying modules will be used for one of the processing targets and which of the processing modules will be used for said one of the processing targets and including different routes constituted by different choices of the carrying module or carrying modules selected from the at least two carrying modules, and then determine specific carrying routes by calculating throughput of the each of the plurality of candidates of carrying routes for the plurality of processing targets based on the operation time of the carrying modules, processing time at the processing modules and operation time and processing time required for another one of the processing targets which will be processed.

2. The semiconductor processing system according to claim 1,
    wherein the operation time of the carrying modules is set by the operation of each of the carrying robots.

3. The semiconductor processing system according to claim 1,
    wherein the processing time at the processing modules is set by each of processing targets to be carried.

4. The semiconductor processing system according to claim 1,
    wherein the operation control unit is configured to determine one of the specific carrying routes among the determined specific carrying routes with the highest throughput among the plurality of candidates.

5. The semiconductor processing system according to claim 1,
    wherein the operation control unit comprises:
    a processing module extracting unit configured to extract an available processing module among the plurality of the processing modules,
    a carrying route candidate generating unit configured to generate a candidate for the carrying route on which the processing target is carried on the basis of information of the extracted available processing module, and
    a throughput calculating unit configured to calculate the throughput of the generated carrying route.

6. The semiconductor processing system according to claim 5,
    wherein the operation control unit is configured to generate destination candidate information used for carrying the processing target based on the information of the extracted available processing module and the carrying route candidate generating unit is configured to generate the carrying route candidate on which the processing target is carried using the generated destination candidate information and the device structure information that is preliminarily stored in a storing device.

7. The semiconductor processing system according to claim 6,
    wherein the throughput calculating unit is configured to perform a simulation, for all the carrying route candidates, in which operations performed by the respective units on the basis of the destination candidate information, the carrying route candidate information, and the device structure information are laid out in time series, and to calculate the throughput of each carrying route candidate on the basis of the simulation result.

8. The semiconductor processing system according to claim 1,
    wherein the carrying modules and the processing modules are kept at a vacuum state, one of the carrying modules is coupled to the load lock in which the pressure can be reduced or increased, and the processing targets are carried into the carrying modules through the load lock.

9. The semiconductor processing system according to claim 1,
    wherein the one of the processing targets is processed in a series of the processes by using at least two of the plural processing modules.

10. A semiconductor processing method using plural processing modules configured for processing a plurality of processing targets, said method comprising:
    delivering and receiving the processing target to/from the processing modules via at least two carrying modules which include carrying robots;
    controlling operation of the processing modules and the carrying modules via an operation control unit, wherein each of the carrying modules is coupled to at least one of the plural processing modules, and,
    generating a plurality of candidates of carrying routes, via the operation control unit for the plurality of processing targets using a device structure information of the semiconductor processing system, each of the plurality of candidates of carrying routes specifying whether one or both of the carrying modules will be used for one of the processing targets and which of the processing modules will be used for said one of the processing targets and including different routes constituted by different choices of the carrying module or carrying modules selected from the at least two carrying modules, and determining via the operation control unit, specific carrying routes by calculating throughput of an each of the plurality of candidates of the carrying routes for the plurality of processing targets based on the operation time of the carrying modules, processing time at the processing modules and operation time and processing time required for another one of the processing targets which will be processed.

11. The semiconductor processing method according to claim 10,
wherein the operation time of the carrying modules is set by the operation of each carrying robots.

12. The semiconductor processing method according to claim 10,
wherein the processing time at the processing modules is set by each of the processing targets to be carried.

13. The semiconductor processing method according to claim 10, further comprising determining one of the specific carrying routes among the determined specific carrying route with the highest throughput among the plurality of candidates, via the operation control unit.

14. The semiconductor processing method according to claim 10, further comprising:
extracting an available processing module among the plurality of the processing modules, via a processing module extracting unit;
generating a candidate for the carrying route on which the processing target is carried on the basis of information of the extracted available processing module, via a carrying route candidate generating unit; and
calculating the throughput of the generated carrying route via a throughput calculating module.

15. The semiconductor processing method according to claim 14, further comprising:
generating, via the operation control unit, destination candidate information used for carrying the processing target based on the information of the extracted available processing module; and
generating, via the carrying route candidate generating unit, the carrying route candidate on which the processing target is carried using the generated destination candidate information and the device structure information that is preliminarily stored in a storing device.

16. The semiconductor processing method according to claim 15, further comprising:
performing, via the throughput calculating unit, a simulation, for all the carrying route candidates, in which operations performed by the respective units on the basis of the destination candidate information, the carrying route candidate information, and the device structure information are laid out in time series: and
calculating the throughput of each carrying route candidate on the basis of the simulation result.

17. The semiconductor processing method according to claim 10, further comprising:
keeping the carrying modules and the processing modules at a vacuum state;
coupling one of the carrying modules to the load lock in which the pressure can be reduced or increased; and
carrying the processing targets into the carrying modules through the load lock.

18. The semiconductor processing method according to claim 10,
wherein the one of the processing targets is processed in a series of the processes by using at least two of the plural processing modules.

* * * * *